United States Patent [19]
Pastor et al.

[11] Patent Number: 5,344,816
[45] Date of Patent: Sep. 6, 1994

[54] STABLE HIGH OXIDATION STATE SUPERCONDUCTING OXIDES

[75] Inventors: Ricardo C. Pastor, Manhattan Beach; Antonio C. Pastor, deceased, late of Manhattan Beach, by Ricardo C. Pastor, executor; Luisa E. Gorre, deceased, late of Camarillo, by M. Efren Gore, administrator; Keith C. Fuller, Los Angeles, all of Calif.

[73] Assignee: Hughes Aircraft Company, Los Angeles, Calif.

[21] Appl. No.: 23,749

[22] Filed: Feb. 24, 1993

Related U.S. Application Data

[63] Continuation of Ser. No. 781,445, Oct. 23, 1991, abandoned.

[51] Int. Cl.$^5$ .................. C01F 11/02; C01G 3/02; H01L 39/24
[52] U.S. Cl. .................. 505/490; 423/593; 505/725; 505/742; 505/491; 505/500; 505/501
[58] Field of Search ............... 505/1, 742, 725; 423/593

[56] References Cited

U.S. PATENT DOCUMENTS

| | | | |
|---|---|---|---|
| 4,409,260 | 10/1983 | Pastor et al. | 427/82 |
| 4,429,009 | 1/1984 | Pastor et al. | 428/410 |
| 4,462,970 | 7/1984 | Pastor et al. | 423/263 |
| 4,462,974 | 7/1984 | Pastor et al. | 423/335 |
| 4,465,656 | 8/1984 | Pastor et al. | 423/339 |
| 4,916,116 | 4/1990 | Yamazaki | 505/1 |
| 4,929,598 | 5/1990 | Bagley et al. | 505/1 |
| 4,942,152 | 7/1990 | Itozaki et al. | 505/1 |
| 5,079,217 | 1/1992 | Leary | 505/1 |

FOREIGN PATENT DOCUMENTS

| | | |
|---|---|---|
| 3297203 | 12/1988 | Japan. |
| 64-18970 | 1/1989 | Japan. |
| 1147878 | 6/1989 | Japan. |
| 1262680 | 10/1989 | Japan. |

OTHER PUBLICATIONS

Patent Abstracts of Japan, vol. 13, No. 199(C-594) May 11, 1989 & JP,A1018970 (Fujikura Ltd) Jan. 23, 1989.
Patent Abstracts of Japan, vol. 13, No. 224 (C-599) May 24, 1989 & JP,A1037464 (Fujikura Ltd) Feb. 8, 1989.
Database WPIL, Weel 8912, Derwent Publ., Ltd., London GB; AN 89-088420, & JP,A,1037424 (Fujikura CableWorks KK) Feb. 8, 1989.
Patent Abstracts of Japan, vol. 13, No. 29 (C-562) Jan. 23, 1989, & JP,A,63233066 (Fujikura Ltd) Sep. 28, 1988.
Mat. Res. Bull., vol. 16, 1981, pp. 1413–1420, R. C. Pastor, et al., "Reactive Atmosphere Processing of Oxides".
CRC Handbook of Chemistry and Physics, 63rd Edition, Weast (Editor), 1982-83, p. B-21.
Hazen, et al., Physical Review Letters, vol. 60, No. 12, Mar. 21, 1988, "Superconductivity in the High-$T_c$ Bi—Ca—Sr—Cu—O System: Phase Identification", pp. 1174–1177.
Khairullin et al., "Low temperature microwave response of yttrium barium copper oxide superconductors: narror resonance-like peak in ESR", Inst. Nucl. Phys., Synth. Met., vol. date 1988, 29(2-3), Chemical Abstract.
Osi'yan, et al., "Observation of superconductivity in yttrium barium copper oxide ceramics doped with bro- (List continued on next page.)

Primary Examiner—Paul Lieberman
Assistant Examiner—John Boyd
Attorney, Agent, or Firm—V. D. Duraiswamy; W. K. Denson-Low

[57] ABSTRACT

High temperature superconducting oxide materials can be taken to a higher, but stable, state of oxidation by removing H-impurities, such as OH$^-$, using I$_2$/O$_2$ mixtures in a reactive atmosphere process. A higher $T_c$ and a narrower $\Delta T$-transition result.

9 Claims, 4 Drawing Sheets

OTHER PUBLICATIONS mine and iodine", Inst. Fiz. Tverd. Tela, Pis'ma Zh. Eksp. Teor. Fiz., 49(1), Chemical Abstract 1989.

D. P. Devor et al, "Hydroxyl impurity effects in YAG-$(Y_3Al_5O_{12})$", *Journal of Chemical Physics*, vol. 81 (No. 9), pp. 4104–4117 (1984).

L. E. Gorre et al, "Hydrogen impurities inoxides and halides", *Materials Research Bulletin*, vol. 20, pp. 1441–1451 (1985).

R. C. Pastor et al, "Reactive atmosphere processing of oxides", *Materials Research Bulletin*, vol. 16, pp. 1413–1420 (1981).

R. C. Pastor et al, "Crystal growth in a reactive atmosphere", *Materials Research Bulletin*, vol. 10, pp. 117–124 (1975).

R. Dagani, "New Super-conductor", *Chemical and Engineering News*, p. 4 (Feb. 15, 1988).

R. C. Pastor et al, "Impurity-conditioned solid-solid transition in simple halides", *Materials Research Bulletin*, vol. 9, pp. 569–578 (1974).

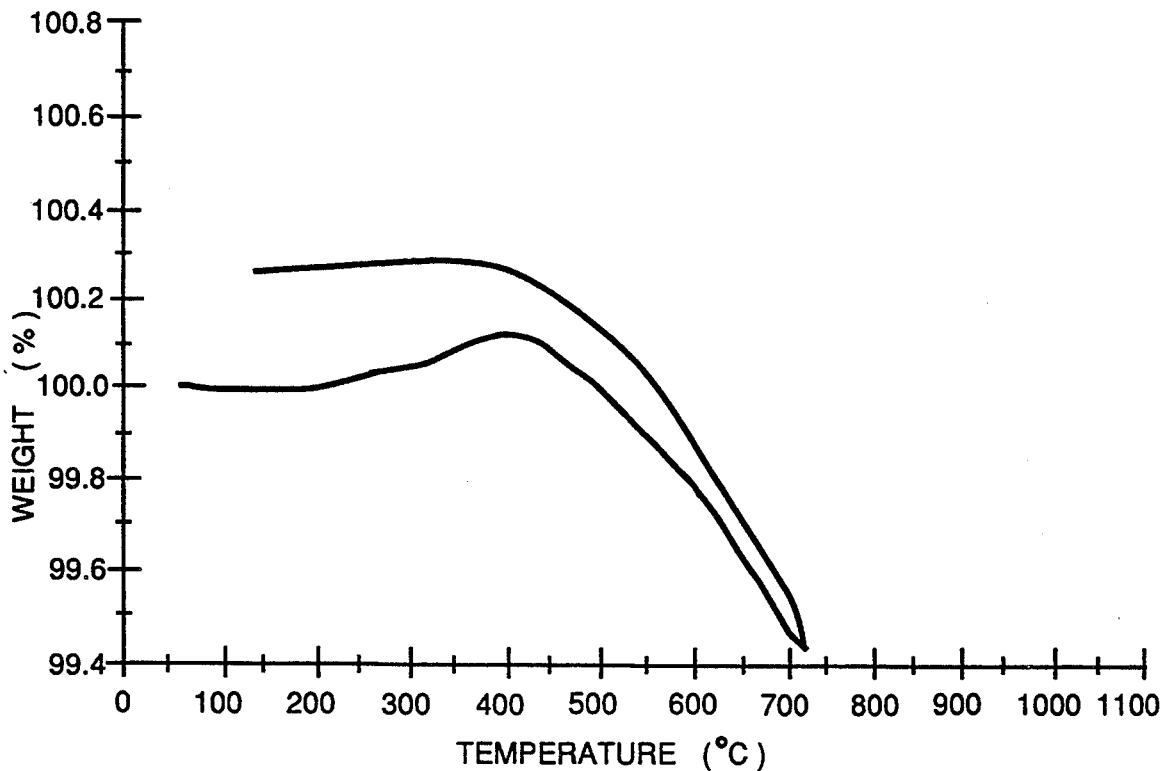
FIG. 4b.
FIG. 5a.
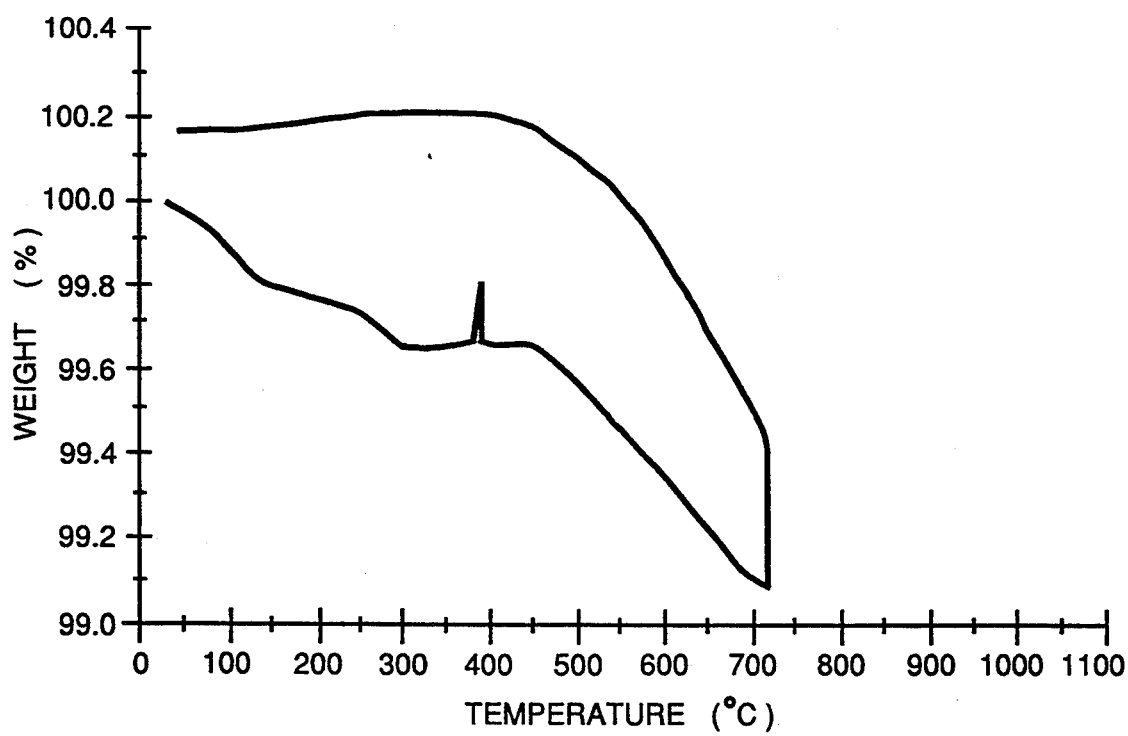

STABLE HIGH OXIDATION STATE SUPERCONDUCTING OXIDES

This is a continuation of application Ser. No. 07/781,445, filed Oct. 23, 1991 now abandoned.

BACKGROUND OF THE INVENTION

1. Field of the Invention

The present invention relates to high temperature superconducting oxides, and, more particularly, to a process for improving the superconducting properties thereof.

2. Description of Related Art

The impurity $OH^-$, in place of $O^-(c)$, blocks charge (hole) transfer, $O^-(c)$ to $O^=(c)$, necessary for superconduction in high temperature superconducting oxides. The removal of $OH^-(c)$ is a necessary step towards achieving a stable higher state of oxidation.

In a paper by D. P. Devor et al, "Hydroxyl impurity effects in YAG($Y_3Al_5O_{12}$)", *Journal of Chemical Physics*, Vol. 81 (No. 9), pp. 4104–4117 (1984), it was shown that $OH^-(c)$ was still present in significant amounts after crystal growth at $\approx 2,000°$ C. High temperature superconducting materials, being processed at a much lower temperature ($\approx 900°$ C.), are expected to have an even higher H-impurity content.

In a paper by L. E. Gorre et al, "Hydrogen impurities in oxides and halides", *Materials Research Bulletin*, Vol. 20, pp. 1441–1451 (1985), it was shown that when the free-$OH^-$ content in vitreous $SiO_2$ was reduced, using the proper reactive atmosphere processing (RAP) oxidizing combination, the lattice contracted and the material became extremely radiation hard. It should be recalled that lattice contraction raises $T_c$ because that parameter has a negative coefficient with pressure.

In a paper by R. C. Pastor et al, "Reactive atmosphere processing of oxides", *Materials Research Bulletin*, Vol. 16, pp. 1413–1420 (1981), the authors studies degradation of rare-earth oxides, particularly $La_2O_3$, by water vapor. They showed that the oxidizing combination of $I_2/O_2$ stabilized $La_2O_3$, prolonging the onset of $H_2O$-uptake by $\approx 4$ hours (induction period). It is now common knowledge that high temperature superconducting oxides, such as $YBa_2Cu_3O_7$, are easily degraded by water (vapor or liquid).

In a paper by R. C. Pastor et al, "Crystal growth in a reactive atmosphere", *Materials Research Bulletin*, Vol. 10, pp. 117–124 (1975), the authors drew attention to the reactivity of the halogen (X) for displacing $OH^-$ impurity by electron transfer,

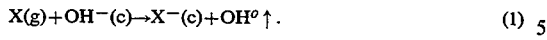

$$X(g) + OH^-(c) \rightarrow X^-(c) + OH° \uparrow. \tag{1}$$

A need remains for a process to improve the superconducting properties and stability of high temperature superconducting oxides.

SUMMARY OF THE INVENTION

In accordance with the invention, a high temperature superconducting oxide is taken to a higher, but stable, state of oxidation by removing H-impurities, such as $OH^-$. A higher $T_c$ and a narrower $\Delta T$-transition result. Any of the well-known so-called high temperature superconducting oxides may be treated in accordance with the teachings of the invention.

BRIEF DESCRIPTION OF THE DRAWINGS

FIGS. 4a and 4b, on coordinates of weight percent and temperature, are TGA thermograms of $YBa_2Cu_3O_7$ annealed under dry $O_2$ (FIG. 4a) and wt $O_2$ (FIG. 4b); and FIG. 5a, on coordinates of weight percent and temperature, is a TGA thermogram of $YBa_2Cu_3O_7$ annealed under $I_2/O_2$.

DESCRIPTION OF THE PREFERRED EMBODIMENTS

High temperature superconducting oxides, such as $(RE)_1Ba_2Cu_3O_{7-x}$, where RE is a rare earth, the Bi-Ca-Sr-Cu-O family, $La_{2-y}Sr_yCuO_4$, and $Tl_2Ba_2CaCu_2O_8$, evidence higher superconducting transition temperature, $T_c$, and narrower $\Delta T$-transition by removal of H-impurities, such as $OH^-$. Current-carrying capability is also increased, along with increased stability toward the degradative action of $H_2O$ and increased resistance to damage by ionizing radiation.

The following two equations display the one-dimensional movement of a hole in a line of oxide ions, with (Eqn. (3)) and without (Eqn. (2)) an incorporated hydroxide:

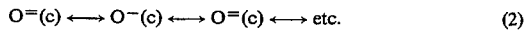

$$O^=(c) \longleftrightarrow O^-(c) \longleftrightarrow O^=(c) \longleftrightarrow \text{etc.} \tag{2}$$

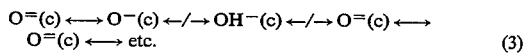

$$O^=(c) \longleftrightarrow O^-(c) \leftarrow/\rightarrow OH^-(c) \leftarrow/\rightarrow O^=(c) \longleftrightarrow O^=(c) \longleftrightarrow \text{etc.} \tag{3}$$

the movement of electrons is, of course, in the opposite direction to the movement of holes, and is just as applicable to the model.

In Eqn. (2), the hole is spread over the dimension by resonance. It is not so, in Eqn. (3); $OH^-(c)$, being a pseudohalide (stable electron configuration), presents a high energy barrier to the transfer. Therefore, a higher and more stable oxidation state may be achieved if $OH^-(c)$ is replaced by $O^-(c)$.

Figures 1, 2:
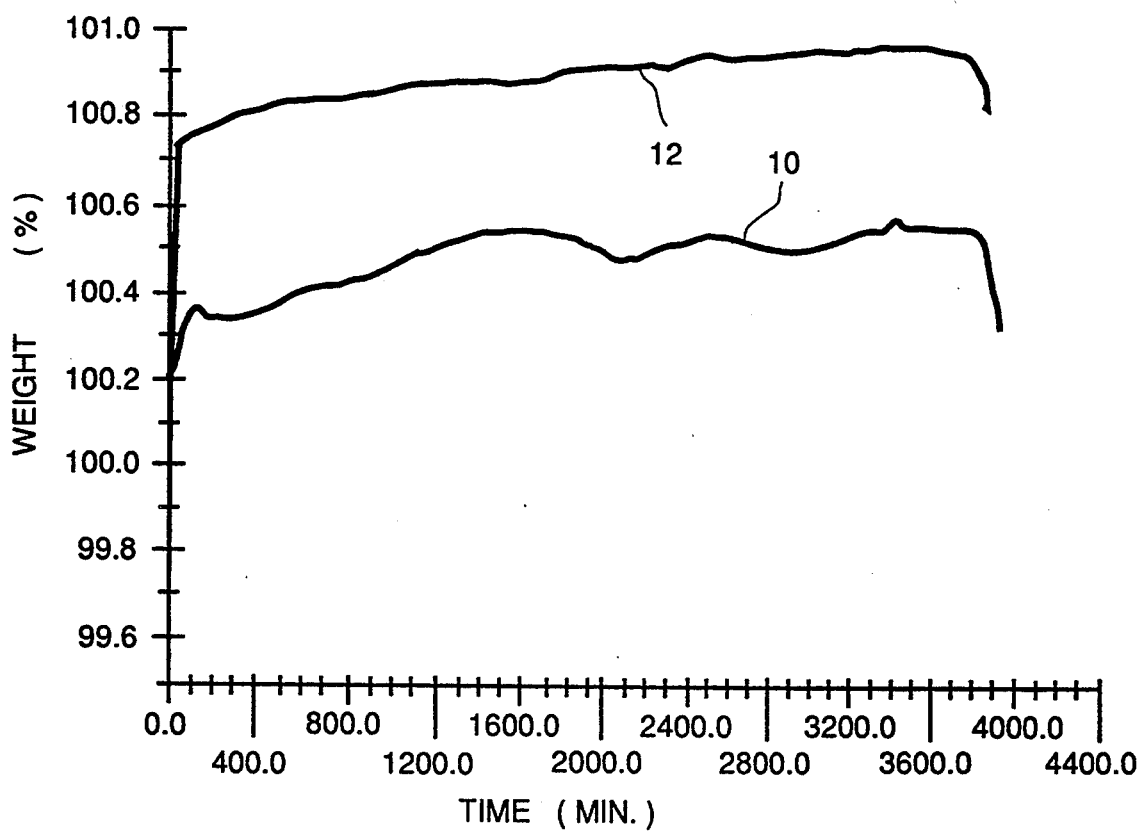
FIG. 1 is a schematic representation of a chemistry oxidation model of a high temperature superconducting oxide.
FIG. 2, on coordinates of weight percent and time, is a thermogravimetric analysis (TGA) thermograms of $YBa_2Cu_3$-$O_{7-x}$ under $I_2/O_2$ and under $O_2$ at 400° C. for 64 hours.

The two-dimensional movement is illustrated in FIG. 1. Movement occurs where (—) is $O^-$, but not where (—) is $OH^-$. The higher state of oxidation in the high temperature superconducting oxide achieved with the use of $I_2/O_2$ over that which made use of $O_2$ alone, as practiced conventionally, is seen in FIG. 2.

FIG. 2 stands for two separate runs on the pristine (unoxidized) samples: one under pure $O_2$ atmosphere (Curve 10) and the other under $I_2/O_2$ (Curve 12); both soaked at 400° C. Weight pickup versus time is the net value between weight loss - removal of $OH^-$ and $H_2O$ - and the incorporation of oxygen as $O^-$. Since it has been shown that no iodine-pickup occurs at 400° C., the layer net weight pickup under $I_2/O_2$ indicates higher content of $O^-$; hence, a higher state of oxidation in the solid. That relates to FIG. 5b, discussed in further detail below, which shows that the superoxidized ($I_2/O_2$) sample suffers the largest weight loss upon thermal cycling to 700° C.

The enthalpy change (units: kcal/mole) for the reaction of Eqn. (1) in the gas phase is $-42.7$ for $X=F$, $-48.0$ for $X=Cl$, $-41.7$ for $X=Br$, and $-36.0$ for $X=I$. However, in an oxide matrix, $X^-$ incorporation is unacceptable. Thus, it must be displaced to restore the oxide stoichiometry,

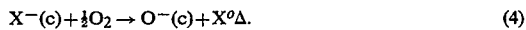

$$X^-(c) + \tfrac{1}{2}O_2 \rightarrow O^-(c) + X^o\Delta. \qquad (4)$$

Figure 3:
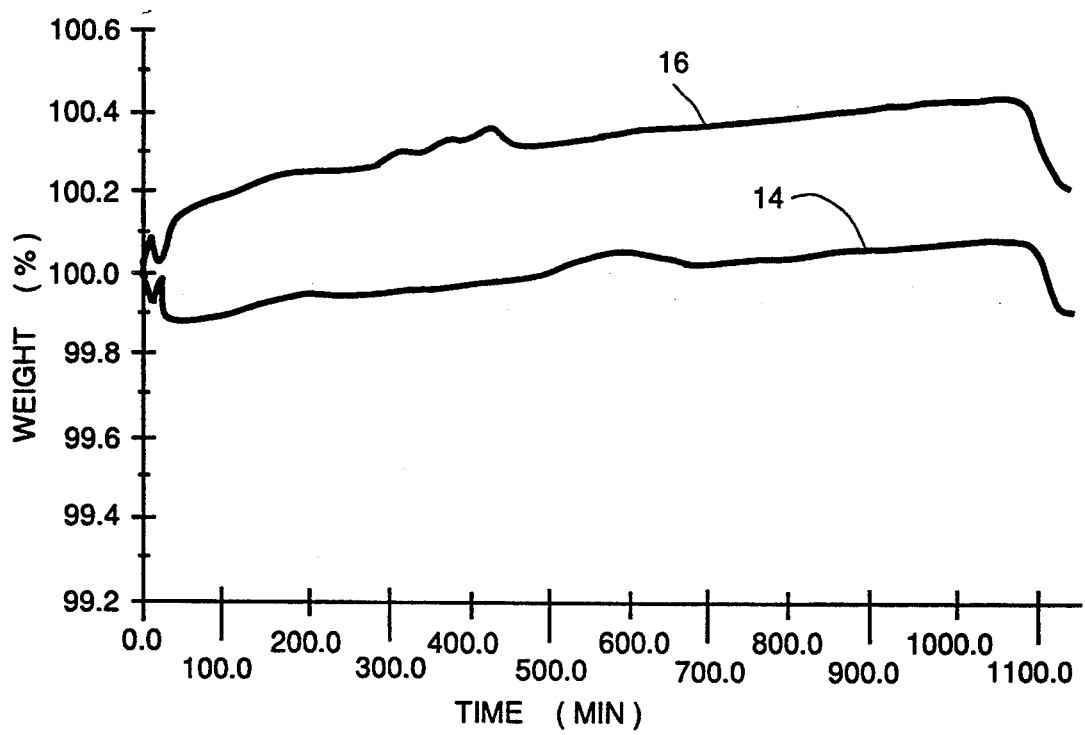
FIG. 3, on coordinates of weight percent and time, is a TGA thermogram of $Bi_4Ca_3Sr_3Cu_4O_{16+x}$ under $I_2/O_2$ and under $O_2$ at 400° C. for 18 hours.

The requirement of Eqn. (4) makes $X=F$ not applicable, since forward displacement of Eqn. (4) is not allowed: oxygen cannot replace fluorine. The equilibrium of Eqn. (4) depends on a component reaction,

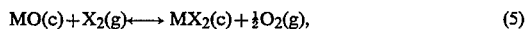

$$MO(c) + X_2(g) \longleftrightarrow MX_2(c) + \tfrac{1}{2}O_2(g), \qquad (5)$$

which, in turn, depends on the electropositive nature of M. Here the reaction has been normalized to one gram-atom oxide. Taking into account the electropositive makeup of M in high temperature superconducting oxides eliminates $X=Cl$. In particular, for $YBa_2Cu_3O_7$, only $X=I$ can be used and in high dilution by the carrier $O_2$; hence, the use of $I_2/O_2$, where $I_2$ is about 1 to 5 mm of Hg and the balance is $O_2$ (total pressure=1 atm). The efficiency of the dilute mixture for achieving a high oxidation state has been shown in FIG. 2. However, where Bi replaces the rare earth as in high temperature superconducting oxides of the Bi-Ca-Sr-Cu-O family, it is possible to use $X=Br$ as well as $X=I$. Attention has been drawn to the Bi-formation not requiring any oxygen annealing; see, e.g., R. Dagani, "New Superconductor", *Chemical and Engineering News*, page 4 (Feb. 15, 1988). The effectiveness of $I_2/O_2$ in raising the Bi-formulation to a higher state of oxidation is seen in FIG. 3, where Curve 14 indicates treatment in pure $O_2$ and Curve 16 indicates treatment in $I_2/O_2$ in accordance with the invention.

In a paper by R. C. Pastor et al, "Impurity-conditioned solid-solid transition in simple halides", *Materials Research Bulletin*, Vol. 9, pp. 569–578 (1974), the appearance of various solid phases does not always occur sequentially in temperature. When pure orthorhombic $RF_3$ (R=a rare earth) is heated in an $H_2O$-free atmosphere, the only phase transformation seen is melting. The melting-freezing behavior is reversible. However, under the 25% humidity of air, a solid-solid transition to hexagonal precedes melting. The behavior is irreversible, the temperature difference between solid-solid transition and melting being dependent on the previous history. Removing the H-impurity eliminated the hexagonal phase, resulting in an increase in the thermal-stability region of the orthorhombic phase. In view of the high $OH^-(c)$ content of conventional high temperature superconducting oxide materials, the tetragonal-to-orthorhombic transition reported in $YBa_2Cu_3O_7$ is symptomatic of the impurity influencing the kinetics of two competing transitions. Thus, reactive atmosphere processing (RAP) oxidation could even extend the thermal stability existence region of the orthorhombic (the superconducting phase) of $YBa_2Cu_3O_7$.

Figure 4A:
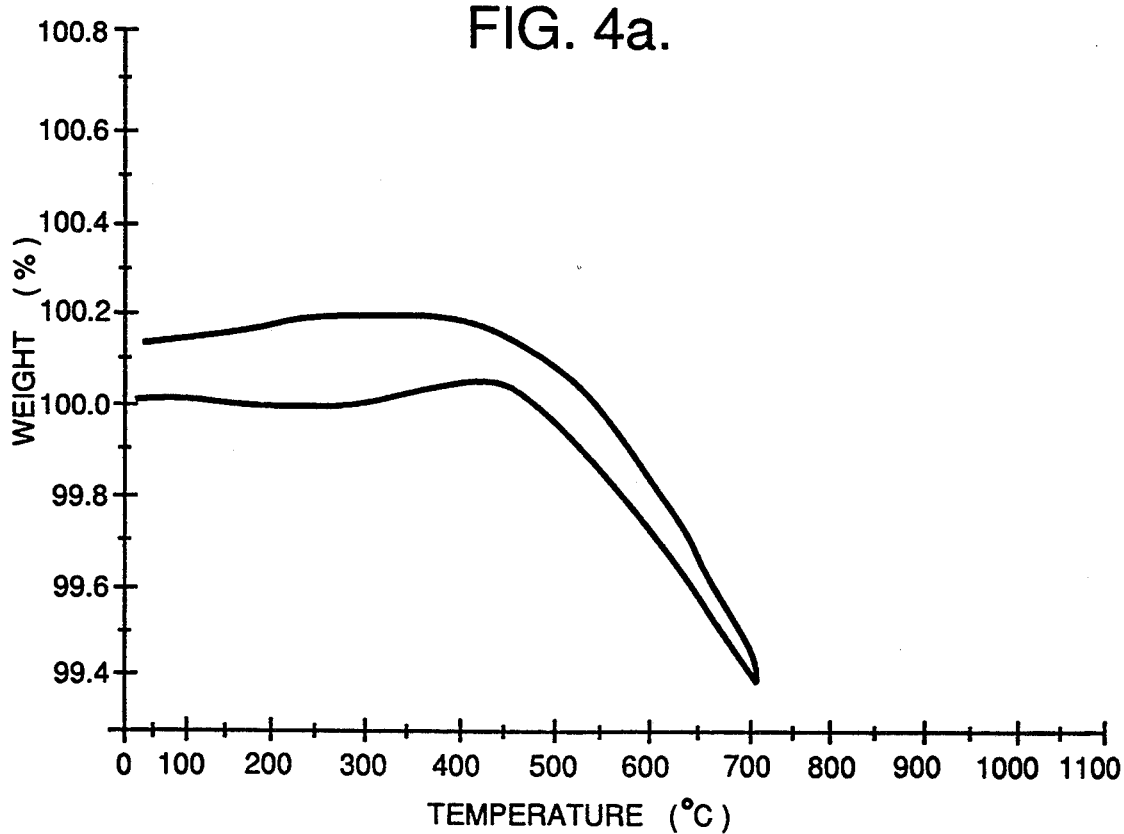

FIG. 4 compares the weight versus temperature behavior of $YBa_2Cu_3O_7$ in dry and wet $O_2$. "Dry" means as taken directly from the gas cylinder and "wet" refers to the same $O_2$ that has been equilibrated to $\approx 100\%$ humidity at 25° C. The lower portion of the curve is the heat-up and the upper portion the cool-down. The slightly higher weight pickup by wet $O_2$ is evidence that, aside from oxygen (presumably as $O^-$), $OH^-(c)$ and interstitial $H_2O$ was also added to the material,

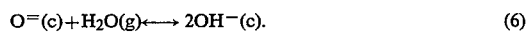

$$O^=(c) + H_2O(g) \longleftrightarrow 2OH^-(c). \qquad (6)$$

While X-ray analysis proved that the orthorhombic structure was preserved, the literature shows that the material annealed in wet $O_2$ will no longer be superconducting; only the "dry" process yields a superconducting material. The sample annealed in dry $O_2$ showed a $T_c$ of $\approx 92K$ and a $\Delta T$ of $\approx 10K$. FIG. 5 shows the behavior under $I_2/O_2$. It will be noted that in FIG. 5(a) that the heat-up portion registers considerable weight loss.

Displacement achieved by means of Eqns. (3) and (4) would not lead to a large weight decrease (mass 17 of $OH^-$ replaced by 16 of $O^-$). The reverse of Eqn. (6) is a weight loss. The process is active in heat-up at the surface for dry $O_2$ and $I_2/O_2$, but not wet $O_2$. That process produces an anion vacancy []. build-up of [] increases the escape tendency of oxide:

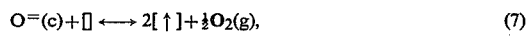

$$O^=(c) + [] \longleftrightarrow 2[\uparrow] + \tfrac{1}{2}O_2(g), \qquad (7)$$

where $[\uparrow]$ is a color center (see, e.g., D. P. Devor et al, supra). However, with a low-energy-barrier oxidation available, such as that represented by Eqns. (3) and (4),

$$2[\uparrow] + O_2(g) \longleftrightarrow 2O^-(c), \qquad (8)$$

Figure 5B:
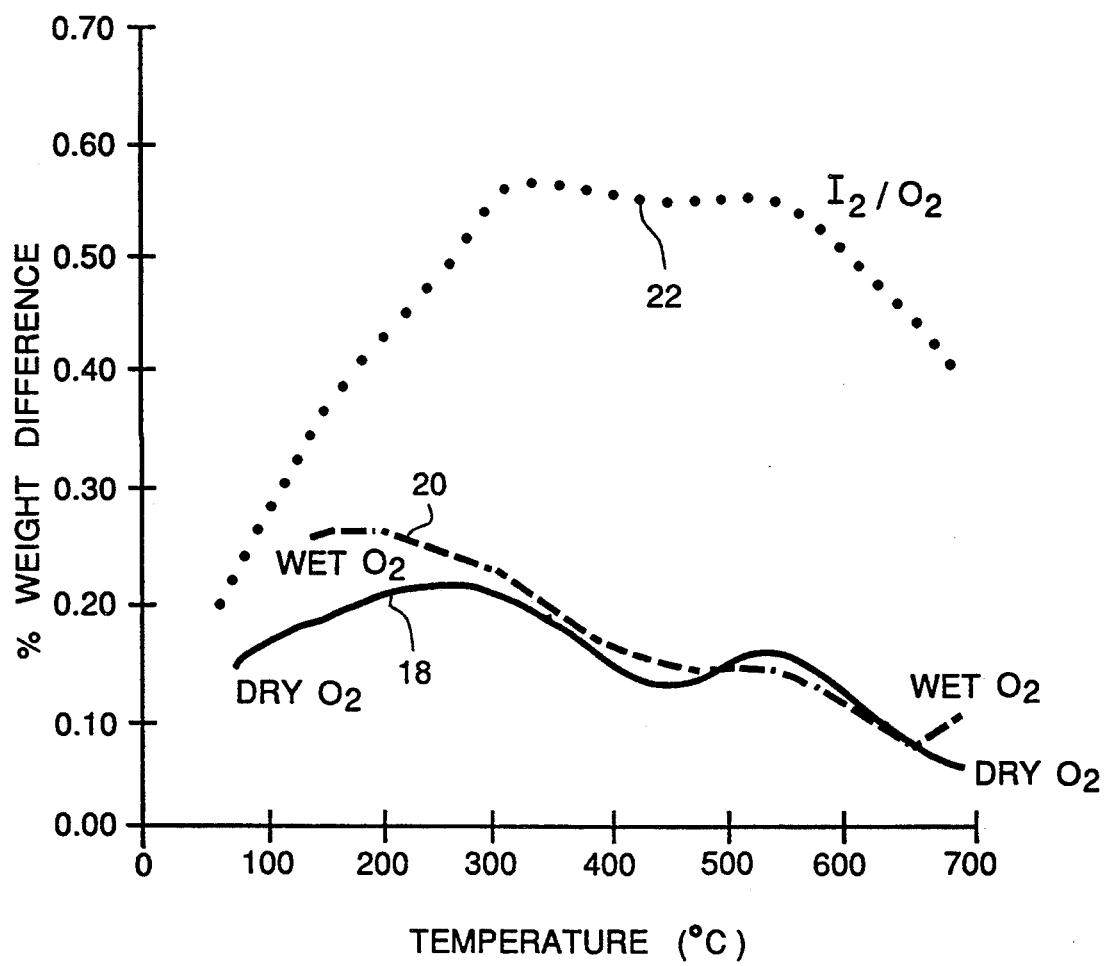
FIG. 5b is a comparison of the weight difference between the heat-up and cool-down curves of $YBa_2Cu_3O_7$ annealed under dry $O_2$, wet $O_2$, and $I_2/O_2$ versus temperature.

The material achieves a higher oxidation state. $YBa_2Cu_3O_7$ treated in accordance with the invention (FIG. 5a) was found to have a $T_c$ of $\approx 101K$ and a $\Delta T$ of $\approx 5K$, or an increase of about 9K in $T_c$ and a decrease in $\Delta T$ of about 5K. FIG. 5b is a plot of the weight difference between heat-up and cool-down versus temperature for the three cases; dry $O_2$ (Curve 18), wt $O_2$ (Curve 20), and $I_2/O_2$ (Curve 22), in accordance with the invention. The weight difference at $\geq 350+$ C. cannot be distinguished between the case of dry and wet $O_2$. That would mean that the pick-up of $OH^-$ by Eqn. (6) from outgas $H_2O$, for the case of dry $O_2$, is just as efficient as in the case of wet $O_2$. However, the behavior is different for the case of $I_2/O_2$. In the presence of the same amount of outgas $H_2O$, the weight difference is considerably higher. That can only be attributed to weight pick-up as incorporated oxygen (presumably $O^=$).

In further support of the efficacy of treating superconducting oxides with $I_2/O_2$, a single crystal of $La_2CuO_4$ was found to be non-superconducting. The measurement was based on zero-field microwave absorption. When this crystal was similarly oxidized by $I_2/O_2$, superconduction started at 20K. Based on such evidence, it is possible that the Bednorz-Muller material, $La_{2-y}Sr_yCuO_4$, which was reported to have a $T_c$ of $\approx 40K$, would have a higher value of $T_c$ and a narrower $\Delta T$ by $I_2/O_2$ oxidation.

As indicated above, the superconducting oxide is treated with a mixture of iodine and oxygen, with the iodine concentration ranging from about 1 to 5 mm of Hg in a total of 1 atm pressure. Below about 1 mm of Hg, the kinetics of the reaction are too slow, while at greater than about 5 mm of Hg, the iodine begins to be absorbed by the oxide. The forward speed of Eqn. (1), namely, displacement of $OH^-$ by iodine, depends on the concentration [I] which, in turn, depends on [$I_2$] and the working temperature. The latter cannot be increased "ad infinitum" without sacrificing the oxidation state. However, one cannot make-up by increase in [$I_2$], as that makes it more difficult to remove incorporated iodine by Eqn. (1) by the displacement action of $O_2$, the reverse direction of Eqn. (5).

As indicated above, the use of bromine is thermodynamically possible for the bismuth-substituted high temperature superconducting oxides. The bromine concentration is expected to be quite less than about 1 mm, with the balance oxygen, in a total of 1 atm pressure.

The flow rate of the gas mixture is about 60 $cm^3$/min, although this is not very critical. $I_2$ is condensed after being passed over the superconducting oxide and recovered for recycling. In a furnace tube about 500 cm long, it takes about 10 to 15 minutes to replenish the atmosphere, and it has been found that this is an adequate flow rate.

The treatment is carried out at a temperature of at least about 850° C.; less than this temperature is too slow to achieve the desired effect. The treatment must be kept below the melting point of the oxide, which for many of these superconducting oxides is about 1,100° C. Preferably, the treatment is carried out at a temperature ranging from about 900° C. to less than about 1,000° C.

The time of treatment is at least a few hours, and may go overnight. Typically, the time of treatment is about 4 to 15 hours.

The superconducting oxide may be treated in powder form or as pellets (after sintering).

Thus, there has been disclosed a process for increasing the superconducting transition temperature and narrowing the $\Delta T$-transition in a high temperature superconducting oxide. It will be readily apparent to one skilled in this art that various changes and modifications of an obvious nature may be made without departing from the spirit of the invention, and all such changes and modifications are considered to fall within the scope of the invention as defined by the appended claims.

What is claimed is:

1. A process for increasing the superconducting transition temperature and narrowing the $\Delta T$-transition in a high critical temperature ($T_c$) superconducting oxide comprising:

(a) heating a superconducting oxide selected from the group consisting of $YBa_2Cu_3O_{7-x}$, $Bi_4Ca_3Sr_3Cu_4O_{16+x}$, and $La_2CuO_4$, wherein x is the variation in oxygen stoichiometry, to a temperature ranging from about 850° C. to below the melting point of said oxide; and (b) treating said oxide with a flowing gas reactive mixture consisting of oxygen and iodine at said temperature to increase the oxidation state of said oxide to a higher oxidation state and avoid absorption of iodine by said oxide, said gas reactive mixture comprising about 1 to 5 mm of Hg of iodine and the balance oxygen in a total atmosphere of about one atm.

2. The process of claim 1 wherein said temperature is less than about 1,100° C.

3. The process of claim 2 wherein said temperature ranges from about 900° C. to less than about 1,000° C.

4. The process of claim 1 wherein said oxide is exposed at said temperature for a period of time of at least about 2 hours.

5. The process of claim 4 wherein said period of time ranges from about 4 to 15 hours.

6. The process of claim 1 wherein said superconducting oxide is in powder form.

7. The process of claim 1 wherein said superconducting oxide is in pellet form and said treatment follows a sintering step to form said pellet.

8. The process of claim 1 wherein said gas mixture is flowed over said superconducting oxide at a rate of about 60 $cm^3$/min.

9. The process of claim 1 wherein said superconducting oxide is in powder form.

* * * * *